United States Patent [19]

VanSlyke et al.

[11] Patent Number: 4,720,432
[45] Date of Patent: Jan. 19, 1988

[54] ELECTROLUMINESCENT DEVICE WITH ORGANIC LUMINESCENT MEDIUM

[75] Inventors: Steven A. VanSlyke; Ching W. Tang; Luther C. Roberts, all of Rochester, N.Y.

[73] Assignee: Eastman Kodak Company, Rochester, N.Y.

[21] Appl. No.: 13,528

[22] Filed: Feb. 11, 1987

[51] Int. Cl.⁴ .......................... B32B 15/04; H01J 1/62; H01L 29/12; C09K 11/06
[52] U.S. Cl. ................. 428/457; 252/301.16; 313/498; 313/504; 313/506; 313/507; 357/8; 428/411.1; 428/461; 428/515; 428/917
[58] Field of Search ............ 428/917, 515, 461, 411.1, 428/457; 313/498, 504, 506, 509; 252/301.16; 357/8

[56] References Cited

U.S. PATENT DOCUMENTS

| | | |
|---|---|---|
| 3,172,862 | 3/1965 | Gurnee et al. ............. 252/301.2 |
| 3,173,050 | 3/1965 | Gurnee ........................ 313/108 |
| 3,710,167 | 1/1973 | Dresner ....................... 313/108 |
| 4,251,612 | 2/1981 | Chu et al. ...................... 430/60 |
| 4,356,429 | 10/1982 | Tang .............................. 313/503 |
| 4,378,418 | 3/1983 | Chu et al. ...................... 430/59 |
| 4,536,457 | 8/1985 | Tam .............................. 430/67 |
| 4,539,507 | 9/1985 | Van Slyke et al. .......... 313/504 |

*Primary Examiner*—Ellis P. Robinson
*Assistant Examiner*—James B. Monroe
*Attorney, Agent, or Firm*—Carl O. Thomas

[57] ABSTRACT

An electroluminescent device is disclosed comprising in sequence, an anode, an organic hole injecting and transporting zone, an organic electron injecting and transporting zone, and a cathode. The organic hole injecting and transporting zone is comprised of a layer in contact with the anode containing a hole injecting porphyrinic compound and a layer containing a hole transporting aromatic tertiary amine interposed between the hole injecting layer and the electron injecting and transporting zone.

20 Claims, 5 Drawing Figures

10 μm ive device is
ELECTROLUMINESCENT DEVICE WITH ORGANIC LUMINESCENT MEDIUM

FIELD OF THE INVENTION

This invention relates to organic electroluminescent devices. More specifically, this invention relates to devices which emit light from a current conducting organic layer.

BACKGROUND OF THE INVENTION

While organic electroluminescent devices have been known for about two decades, their performance limitations have represented a barrier to many desirable applications. (For brevity EL, the common acronym for electroluminescent, is sometimes substituted.)

Representative of earlier organic EL devices are Gurnee et al U.S. Pat. No. 3,172,862, issued Mar. 9, 1965, filed Sept. 9, 1960; Gurnee U.S. Pat. No. 3,173,050, issued Mar. 9, 1965; Dresner, "Double Injection Electroluminescence in Anthracene", *RCA Review*, Vol. 30, pp. 322-334, 1969; and Dresner U.S. Pat. No. 3,710,167, issued Jan. 9, 1973. The organic emitting material was formed of a conjugated organic host material and a conjugated organic activating agent having condensed benzene rings. Naphthalene, anthracene, phenanthrene, pyrene, benzopyrene, chrysene, picene, carbazole, fluorene, biphenyl, terphenyls, quarterphenyls, triphenylene oxide, dihalobiphenyl, trans-stilbene, and 1,4-diphenylbutadiene were offered as examples of organic host materials. Anthracene, tetracene, and pentacene were named as examples of activating agents. The organic emitting material was present as a single layer having thicknesses above 1 μm.

The most recent discoveries in the art of organic EL device construction have resulted from EL device constructions with the organic luminescent medium consisting of two extremely thin layers (<1.0 μm in combined thickness) separating the anode and cathode, one specifically chosen to inject and transport holes and the other specifically chosen to inject and transport electron and also acting as the organic luminescent zone of the device. The extremely thin organic luminescent medium offers reduced resistance, permitting higher current densities for a given level of electrical biasing. Since light emission is directly related to current density through the organic luminescent medium, the thin layers coupled with increased charge injection and transport efficiencies have allowed acceptable light emission levels (e.g., brightness levels capable of being visually detected in ambient light) to be achieved for the first time with low applied voltages in ranges compatible with integrated circuit drivers, such as field effect transistors.

For example, Tang U.S. Pat. No. 4,356,429 discloses an EL device formed of an organic luminescent medium consisting of a hole injecting and transporting layer containing a porphyrinic compound and an electron injecting and transporting layer also acting as the luminescent zone of the device. In Example 1 an EL device is disclosed formed of a conductive glass transparent anode, a 1000 Angstrom hole injecting and transporting layer of copper phthalocyanine, a 1000 Angstrom electron injecting and transporting layer of tetraphenylbutadiene in poly(styrene) also acting as the luminescent zone of the device, and a silver cathode. The EL device emitted blue light when biased at 20 volts at an average current density in the 30 to 40 mA/cm² range. The brightness of the device was 5 cd/m².

A further improvement in such organic EL devices is taught by Van Slyke et al U.S. Pat. No. 4,539,507. Van Slyke et al realized a dramatic improvement in light emission by substituting for the hole injecting and transporting porphyrinic compound of Tang an aromatic tertiary amine layer. Referring to Example 1, onto a transparent conductive glass anode were vaccum vapor deposited successive 750 Angstrom hole injecting and transporting 1,1-bis(4-di-p-tolylaminophenyl)cyclohexane and electron injecting and transporting 4,4'-bis(5,7-di-t-pentyl-2-benzoxazolyl)-stilbene layers, the latter also providing the luminescent zone of the device. Indium was employed as the cathode. The EL device emitted blue-green light (520 nm peak). The maximum brightness achieved 340 cd/m² at a current density of about 140 mA/cm² when the applied voltage was 22 volts. The maximum power conversion efficiency was about $1.4 \times 10^{-3}$ watt/watt, and the maximum EL quantum effeiciency was about $1.2 \times 10^{-2}$ photon/electron when driven at 20 volts. Note particularly that Example 1 of Van Slyke et al produced a maximum brightness of 340 cd/m² when the EL device was driven at 22 volts while Example 1 of Tang produced only 5 cd/m² when that EL device was driven at 20 volts.

The organic EL devices have been constructed of a variety of cathode materials. Early investigations employed alkali metals, since these are the lowest work function metals. Other cathode materials taught by the art have been higher work function (4 eV or greater) metals, including combinations of these metals, such as brass, conductive metal oxides (e.g., indium tin oxide), and single low work function (<4 eV) metals. Gurnee et al and Gurnee, cited above, disclosed electrodes formed of chrome, brass, copper, and conductive glass. Dresner U.S. Pat. No. 3,710,167 employed a tunnel injection cathode consisting of aluminum or degenerate N+ silicon with a layer of the corresponding aluminum or silicon oxide of less 10 Angstroms in thickness. Tang, cited above, teaches useful cathodes to be formed from single metals with a low work function, such as indium, silver, tin, and aluminum while Van Slyke et al, cited above, discloses a variety of single metal cathodes, such as indium, silver, tin, lead, magnesium, manganese, and aluminum.

Tang et al U.S. Ser. No. 13,530, concurrently filed and commonly assigned, titled ELECTROLUMINESCENT DEVICE WITH IMPROVED CATHODE, discloses an EL device comprised of a cathode formed of a plurality of metals other than alkali metals, at least one of which has a work function of less than 4 eV.

SUMMARY OF THE INVENTION

Although recent preformance inprovements in organic EL devices have suggested a potential for widespread use, most practical applications require limited voltage input or light output variance over an extended period of time. While the aromatic tertiary amine layers employed by Van Slyke et al, cited above, have resulted in highly attractive initial light outputs in organic EL devices, the limited stability of devices containing these layers has remained a deterrent to widespread use. Device degradation result in obtaining progressively lower current densities when a constant voltage is applied. Lower current densities in turn result in lower levels of light output. With a constant applied voltage, practical EL device use terminates when light emission levels drop below acceptable levels—e.g., readily visually detectable emission levels in ambient lighting. If the applied voltage is progressively increased to hold light emission levels constant, the field across the EL device is correspondingly increased. Eventually a voltage level is required that cannot be conveniently supplied by the EL device driving circuitry or which produces a field gradient (volts/cm) exceeding the dielectric breakdown strength of the layers separating the electrodes, resulting in a catastrophic failure of the EL device.

It has been discovered quite surprisingly that stability and sustained operating performance of the organic EL devices of Van Slyke et al, cited above, can be markedly improved by forming the hole injecting and transporting zone of the organic luminescent medium of two distinct layers, one specifically chosen to interface with the anode and inject holes and one specifically chosen to interface with and transport holes to the electron injecting and transporting organic layer. In this respect the organic EL devices of this invention differ from those previously known to the art in forming the organic luminescent medium of a minimum of three distinct layers of differing composition, each tailored to perform a specific role in charge handling and luminescence.

In one aspect this invention is directed to an electroluminescent device comprising in sequence, an anode, an organic hole injecting and transporting zone, an organic electron injecting and transporting zone, and a cathode, characterized in that the organic hole injecting and transporting zone is comprised of a layer in contact with anode containing a hole injecting porphyrinic compound and a layer containing a hole transporting aromatic tertiary amine interposed between the hole injecting layer and the electron injecting and transporting zone.

When organic EL devices according to this invention are constructed with cathodes formed of a plurality of metals other than alkali metals, at least one of the metals having a work function of less than 4 eV, as taught by Tang et al, cited above, further advantages are realized.

Therefore, in another aspect this invention is directed to an electroluminescent device comprising in sequence, an anode, an organic hole injecting and transporting zone, an organic electron injecting and transporting zone, and a cathode, characterized in that (1) the organic hole injecting and transporting zone is comprised of a layer in contact with the anode containing a hole injecting porphyrinic compound and a layer containing a hole transporting aromatic tertiary amine interposed between the hole injecting layer and the electron injecting and transporting zone and (2) the cathode is comprised of a layer consisting of a plurality of metals other than alkali metals, at least one of the metals having a work function of less than 4 eV.

In addition to the stability advantages of the organic luminescent medium discussed above, it has been further discovered quite unexpectedly that the combination of a low work function metal and at least one other metal in the cathode of an organic EL device results in improving the stability of the cathode and consequently the stability of the device. It has been observed that the initial performance advantages of low work function metals other than alkali metals as cathode materials are only slightly diminished when combined with more stable, higher work function metals while marked extensions of EL device lifetimes are realized with even small amounts of a second metal being present. Further, the advantages in extended lifetimes can be realized even when the cathode metals are each low work function metals other than alkali metals. Additionally, the use of combinations of metals in forming the cathodes of the organic EL devices of this invention has resulted in unexpected advantages in fabrication, such as improved acceptance by the electron transporting organic layer during vacuum vapor deposition of the cathode.

Another unexpected advantage realized with the cathode metal combination of this invention is that low work function metals can be employed to prepare cathodes which are light transmissive and at the same time exhibit low levels of sheet resistance. Thus, the option is afforded of organic EL device constructions in which the anode need not perform the function of light transmission, thereby affording new use opportunities for organic EL devices.

BRIEF DESCRIPTION OF THE DRAWINGS

These and other advantages of this invention can be better appreciated by reference to the following detailed description considered in conjunction with the drawings, in which.

The drawings are necessarily of a schematic nature, since the thickness of the individual layers are too thin and thickness differences of the various device elements too great to permit depiction to scale or to permit convenient proportionate scaling.

DESCRIPTION OF PREFERRED EMBODIMENTS

Figure 1:
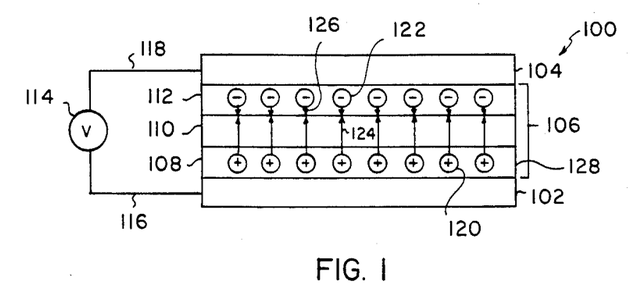
FIGS. 1, 2, and 3 are schematic diagrams of EL devices.

An electroluminescent or EL device 100 according to the invention is schematically illustrated in FIG. 1. Anode 102 is separated from cathode 104 by an organic luminescent medium 106, which, as shown, consists of three superimposed layers. Layer 108 located on the anode forms a hole injecting zone of the organic luminescent medium. Located above the hole injecting layer is layer 110, which forms a hole transporting zone of the organic luminescent medium. Interposed between the hole transporting layer and the cathode is layer 112, which forms an electron injecting and transporting zone of the organic luminescent medium. The anode and the cathode are connected to an external power source 114 by conductors 116 and 118, respectively. The power source can be a continuous direct current or alternating current voltage source or an intermittent current voltage source. Any convenient conventional power source, including any desired switching circuitry, can be employed which is capable of positively biasing the anode with respect to the cathode. Either the anode or cathode can be at ground potential.

The EL device can be viewed as a diode which is forward biased when the anode is at a higher potential than the cathode. Under these conditions injection of holes (positive charger carriers) occurs into the lower organic layer, as schematically shown at 120, while electrons are injected into the upper organic layer, as schematically shown at 122, into the luminescent medium. The injected holes and electrons each migrate toward the oppositely charged electrode, as shown by the arrows 124 and 126, respectively. This results in hole-electron recombination. When a migrating electron drops from its conduction potential to a valence band in filling a hole, energy is released as light. Hence the organic luminescent medium forms between the electrodes a luminescence zone receiving mobile charge carriers from each electrode. Depending upon the choice of alternative constructions, the released light can be emitted from the organic luminescent material through one or more edges 128 of the organic luminescent medium separating the electrodes, through the anode, through the cathode, or through any combination of the foregoing.

Reverse biasing of the electrodes reverses the direction of mobile charge migration, depletes the luminescent medium of mobile charge carriers, and terminates light emission. The most common mode of operating organic EL devices is to employ a forward biasing d.c. power source and to rely on external current interruption or modulation to regulate light emission.

Since the organic luninescent medium is quite thin, it is usually preferred to emit light through one of the two electrodes. This is achieved by forming the electrodes as a translucent or transparent coating, either on the organic luminescent medium or on a separate translucent or transparent support. The thickness of the coating is determined by balancing light transmission (or extinction) and electrical conductance (or resistance). A practical balance in forming a light transmissive metallic electrode is typically for the conductive coating to be in the thickness range of from about 50 to 250 Angstroms. Where the electrode is not intended to transmit light or is formed of a transparent material, such as a transparent conductive metal oxide, any greater thickness found convenient in fabrication can also be employed.

Figure 2:
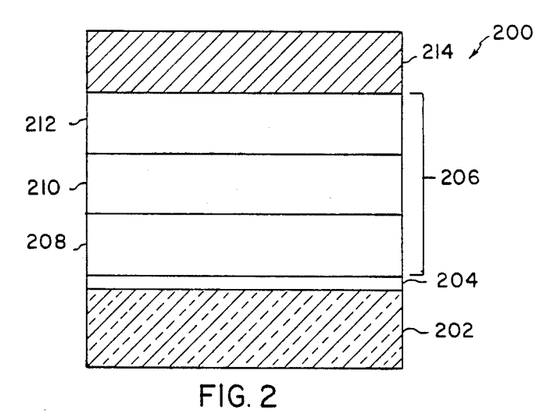

Organic EL device 200 shown in FIG. 2 is illustrative of one preferred embodiment of the invention. Because of the historical development of organic EL devices it is customary to employ a transparent anode. This is achieved by providing a transparent insulative support 202 onto which is deposited a conductive light transmissive relatively high work function metal or metal oxide layer to form anode 204. The organic luminescent medium 206 and therefore each of its layers 208, 210, and 212 correspond to the medium 106 and its layers 108, 110, and 112, respectively, and require no further description. With preferred choices of materials, described below, forming the organic luminescent medium the layer 212 is the zone in which luminescence occurs. The cathode 214 is conveniently formed by deposition on the upper layer of the organic luminescent medium.

Figure 3:
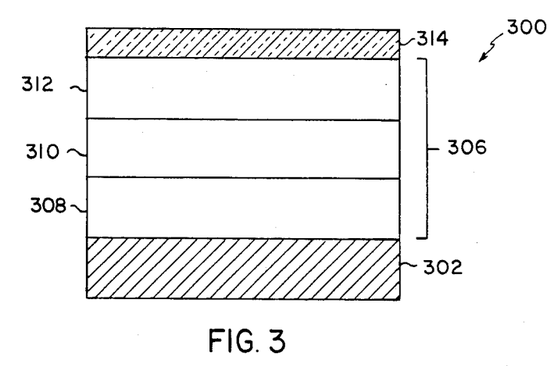

Organic EL device 300, shown in FIG. 3, is illustrative of another preferred embodiment of the invention. Contrary to the historical pattern of organic EL device development, light emission from the device 300 is through the light transmissive (e.g., transparent or substantially transparent) cathode 314. While the anode of the device 300 can be formed identically as the device 200, thereby permitting light emission through both anode and cathode, in the preferred form shown the device 300 employs an opaque charge conducting element forming the anode 302, such as a relatively high work function metallic substrate. The organic luminescent medium 306 and therefore each of its layers 308, 310, and 312 correspond to the medium 106 and layers 108, 110, and 112, respectively, and require no further description. The significant difference between devices 200 and 300 is that the latter employs a thin, light transmissive (e.g., transparent or substantially transparent) cathode in place of the opaque cathode customarily included in organic EL devices and, in most instances, employs an opaque anode instead of the light transmissive anode normally employed.

Viewing organic EL devices 200 and 300 together, it is apparent that the present invention offers the option of mounting the devices on either a positive or negative polarity opaque substrate.

The organic luminescent medium of the EL devices of this invention contains a minimum of three separate organic layers, at least one layer forming the electron injecting and transporting zone of the device, and at least two layers forming the hole injecting and transporting zone, one layer of the latter zone providing a hole injecting zone and the remaining layer providing a hole transporting zone.

A layer containing a porphyrinic compound forms the hole injecting zone of the organic EL device. A porphyrinic compound is any compound, natural or synthetic, which is derived from or includes a porphyrin structure, including porphine itself. Any of the porphyrinic compounds disclosed by Adler U.S. Pat. No. 3,935,031 or Tang U.S. Pat. No. 4,356,429, the disclosures of which are here incorporated by reference, can be employed.

Preferred porphyrinic compounds are those of structural formula (I):

wherein

Q is —N= or —C(R)=;

M is a metal, metal oxide, or metal halide;

R is hydrogen, alkyl, aralkyl, aryl, or alkaryl, and $T^1$ and $T^2$ represent hydrogen or together complete a unsaturated 6 membered ring, which can include substituents, such as alkyl or halogen. Preferred 6 membered rings are those formed of carbon, sulfur, and nitrogen ring atoms. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogen for the metal atom, as indicated by formula (II):

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:
PC-1: Porphine
PC-2: 1,10,15,20-Tetraphenyl-21H,23H-porphine copper (II)
PC-3: 1,10,15,20-Tetraphenyl-21H,23H-porphine zinc (II)
PC-4: 5,10,15,20-Tetrakis(pentafluorophenyl)-21H,23H-porphine
PC-5: Silicon phthalocyanine oxide
PC-6: Aluminum phthalocyanine chloride
PC-7: Phthalocyanine (metal free)
PC-8: Dilithium phthalocyanine
PC-9: Copper tetramethylphthalocyanine
PC-10: Copper phthalocyanine
PC-11: Chromium phthalocyanine fluoride
PC-12: Zinc phthalocyanine
PC-13: Lead phthalocyanine
PC-14: Titanium phthalocyanine oxide
PC-15: Magnesium phthalocyanine
PC-16: Copper octamethylphthalocyanine

The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinly or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (III):

wherein
$Q^1$ and $Q^2$ are independently aromatic tertiary amine moieties and
G is a linking group such an arylene, cycloalkylene, or alkylene group of a carbon to carbon bond.

A particularly preferred class of class of triarylamines satisfying structural formula (III) and containing two triarylamine moieties are those satisfying structural formula (IV):

where
$R^1$ and $R^2$ each independently represents a hydrogen atom, an aryl group, or an alkyl group or $R^1$ and $R^2$ together represent the atoms completing a cycloalkyl group and
$R^3$ and $R^4$ each independently represents an aryl group which is in turn substituted with a diaryl substituted amino group, as indicated by structural formula (V):

wherein $R^5$ and $R^6$ are independently selected aryl groups.

Another preferred class of aromatic tertiary amines are tetraaryldiamines. Preferred tetraaryldiamines include two diarylamino groups, such as indicated by formula (V), linked through an arylene group. Preferred tetraaryldiamines include those represented by formula (VI).

wherein
Are is an arylene group,
n is an integer of from 1 to 4, and
Ar, $R^7$, $R^8$, and $R^9$ are independently selected aryl groups.

The various alkyl, alkylene, aryl, and arylene moieties of the foregoing structural formulae (III), (IV), (V), can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

While the entire hole transporting layer of the organic electroluminesce medium can be formed of a single aromatic tertiary amine, it is a further recognition of this invention that increased stability can be realized by employing a combination of aromatic tertiary amines. Specifically, as demonstrated in the examples below, it has been observed that employing a triarylamine, such as a triarylamine satisfying formula (IV), in combination with a tetraaryldiamine, such as indicated by formula (VI), can be advantageous. When a triarylamine is employed in combination with a tetraaryldiamine, the latter is positioned as a layer interposed between the triarylamine and the electron injecting and transporting layer.

Representative useful aromatic tertiary amines are disclosed by Berwick et al U.S. Pat. No. 4,175,960 and Van Slyke et al U.S. Pat. No. 4,539,507, here incorporated by reference. Berwick et al in addition discloses as useful hole transporting compounds N substituted carbazoles, which can be viewed as ring bridged variants of the diaryl and triarylamines disclosed above.

Illustrative of useful aromatic tertiary amines are the following:
ATA-1: 1,1-Bis(4-di-p-tolylaminophenyl)cyclohexane
ATA-2: 1,1-Bis(4-di-p-tolylaminophenyl)-4-phenylcyclohexane
ATA-3: 4,4'-Bis(diphenylamino)quadriphenyl
ATA-4: Bis(4-dimethylamino-2-methylphenyl)-phenylmethane
ATA-5: N,N,N-Tri(p-tolyl)amine
ATA-6: 4-(di-p-tolylamino)-4'-[4(di-p-tolylamino)-styryl]stilbene
ATA-7: N,N,N',N'-Tetra-p-tolyl-4,4'-diaminobiphenyl
ATA-8: N,N,N',N'-Tetraphenyl-4,4'-diaminobiphenyl
ATA-9: N-Phenylcarbazole
ATA-10: Poly(N-vinylcarbazole)

Any conventional electron injecting and transporting compound or compounds can be employed in forming the layer of the organic luminescent medium adjacent the cathode. This layer can be formed by historically taught luminescent materials, such as anthracene, naphthalene, phenanthrene, pyrene, chrysene, and perylene and other fused ring luminescent materials containing up to about 8 fused rings as illustrated by Gurnee et al U.S. Pat. No. 3,172,862, Gurnee U.S. Pat. No. 3,173,050, Dresner, "Double Injection Electroluminescence in Anthracene", RCA Review, Vol. 30, pp. 322-334, 1969; and Dresner U.S. Pat. No. 3,710,167, cited above. Although such fused ring luminescent materials do not lend themselves to forming thin (<1 μm) films and therefore do not lend themselves to achieving the highest attainable EL device performance levels, organic EL devices incorporating such luminescent materials when constructed according to the invention show inprovements in performance and stability over otherwise comparable prior art EL devices.

Among electron transporting compounds useful in forming thin films are the butadienes, such as 1,4-diphenylbutadiene and tetraphenylbutadiene; coumarins; and stilbenes, such as trans-stilbene, disclosed by Tang U.S. Pat. No. 4,356,429, cited above.

Still other thin film forming electron transporting compounds which can be used to form the layer adjacent the cathode are optical brighteners, particularly those disclosed by Van Slyke et al U.S. Pat. No. 4,539,507, cited above and here incorporated by reference. Useful optical brighteners include those satisfying structural formulae (VII) and (VIII):

(VII)

(VIII)

wherein
$R^1$, $R^2$, $R^3$, and $R^4$ are individually hydrogen; saturated aliphatic of from 1 to 10 carbon atoms, for example, propyl, t-butyl, heptyl, and the like; aryl of from 6 to 10 carbon atoms, for example, phenyl and naphthyl; or halo such as chloro, fluoro, and the like; or $R^1$ and $R^2$ or $R^3$ and $R^4$ taken together comprise the atoms necessary to complete a fused aromatic ring optionally bearing at least one saturated aliphatic of from 1 to 10 carbon atoms, such as methyl, ethyl, propyl and the like;

$R^5$ is a saturated aliphatic of from 1 to 20 carbon atoms, such as methyl, ethyl, n-eicosyl, and the like; aryl of from 6 to 10 carbon atoms, for example, phenyl and naphthyl; carboxyl; hydrogen; cyano; or halo, for example, chloro, fluoro and the like; provided that in formula (VIII) at least two of $R^3$, $R^4$ and $R^5$ are saturated aliphatic of from 3 to 10 carbon atoms, e.g., propyl, butyl, heptyl and the like;

Z is —O—, —NH—, or —S—; and
Y is wherein
m is an integer of from 0 to 4;
n is arylene of from 6 to 10 carbon atoms, for example phenylene and naphthylene; and
Z' and Z" are individually N or CH.

As used herein "aliphatic" includes substituted aliphatic as well as unsubstituted aliphatic. The substituents in the case of substituted aliphatic include alkyl of from 1 to 5 carbon atoms, for example, methyl, ethyl, propyl and the like; aryl of from 6 to 10 carbon atoms, for example phenyl and naphthyl; halo, such as chloro, fluoro and the like; nitro; and alkoxy having 1 to 5 carbon atoms, for example, methoxy, ethoxy, propoxy, and the like.

Still other optical brighteners that are contemplated to be useful are listed in Vol. 5 of *Chemistry of Synthetic Dyes*, 1971, pages 618-637 and 640. Those that are not already thin-film-forming can be rendered so by attaching an aliphatic moiety to one or both end rings.

Particularly preferred thin film forming materials for use in forming the electron injecting and transporting layers of the organic EL devices of this inventions are metal chelated oxinoid compounds, including chelates of oxine itself (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (IX):

(IX)

wherein
Me represents a metal;
n is an integer of from 1 to 3; and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

CO-1: Aluminum trisoxine [a.k.a., tris(8-quinolinol)aluminum]
CO-2: Magnesium bisoxine [a.k.a., bis(8-quinolinol)magnesium]
CO-3: Bis[benzo{f}-8-quinolinol]zinc
CO-4: Bis(2-methyl-8-quinolinolato)aluminum oxide
CO-5: Indium trisoxine [a.k.a., tris(8-quinolinol)indium]
CO-6: Aluminum tris(5-methyloxine) [a.k.a., tris(5-methyl-8-quinolinol)aluminum
CO-7: Lithium oxine (a.k.a., 8-quinolinol lithium]
CO-8: Gallium tris(5-chlorooxine) [a.k.a, tris(5-chloro-8-quinolinol)gallium]
CO-9: Calcium bis(5-chlorooxine) [a.k.a, bis(5-chloro-8-quinolinol)calcium]
CO-10: Poly[zinc (II)-bis(8-hydroxy-5-quinolinyl)methane]
CO-11: Dilithium epindolidione In the organic EL devices of the invention it is possible to maintain a current density compatible with efficient light emission while employing a relatively low voltage across the electrodes by limiting the total thickness of the organic luminescent medium to less than 1 μm (10,000 Angstroms). At a thickness of less than 1 μm an applied voltage of 20 volts results in a field potential of greater than $2 \times 10^5$ volts/cm, which is compatible with efficient light emission. An order of magnitude reduction (to 0.1 μm or 1000 Angstroms) in thickness of the organic luminescent medium, allowing further reductions in applied voltage and/or increase in the field potential and hence current density, are well within device construction capabilities.

One function which the organic luminescent medium performs is to provide a dielectric barrier to prevent shorting of the electrodes on electrical biasing of the EL device. Even a single pin hole extending through the organic luminescent medium will allow shorting to occur. Unlike conventional EL devices employing a single highly crystalline luminescent material, such as anthracene, for example, the EL devices of this invention are capable of fabrication at very low overall organic luminescent medium thicknesses without shorting. One reason is that the presence of three superimposed layers greatly reduces the chance of pin holes in the layers being aligned to provide a continuous conduction path between the electrodes. This in itself permits one or even two of the layers of the organic luminescent medium to be formed of materials which are not ideally suited for film formation on coating while still achieving acceptable EL device performance and reliability.

The preferred materials for forming the organic luminescent medium are each capable of fabrication in the form of a thin film—that is, capable of being fabricated as a continuous layer having a thickness of less than 0.5 μm or 5000 Angstroms.

When one or more of the layers of the organic luminescent medium are solvent coated, a film forming polymeric binder can be conveniently codeposited with the active material to assure a continuous layer free of structural defects, such as pin holes. If employed, a binder must, of course, itself exhibit a high dielectric strength, preferably at least about $2 \times 10^6$ volt/cm. Suitable polymers can be chosen from a wide variety of known solvent cast addition and condensation polymers. Illustrative of suitable addition polymers are polymers and copolymers (including terpolymers) of styrene, t-butylstyrene, N-vinyl carbazole, vinyltoluene, methyl methacrylate, methyl acrylate, acrylonitrile, and vinyl acetate. Illustrative of suitable condensation polymers are polyesters, polycarbonates, polyimides, and polysulfones. To avoid unnecessary dilution of the active material, binders are preferably limited to less than 50 percent by weight, based on the total weight of the material forming the layer.

The preferred active materials forming the organic luminescent medium are each film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited porphorinic compound as a hole injecting layer, a film forming aromatic tertiary amine as a hole transporting layer (which can in turn be comprised of a triarylamine layer and a tetraaryldiamine layer), and a chelated oxinoid compound as an electron injecting and transporting layer, individual layer thicknesses in the range of from about 50 to 5000 Angstroms are contemplated, with layer thicknesses in the range of from 100 to 2000 Angstroms being preferred. It is generally preferred that the overall thickness of the organic luminescent medium be at least about 1000 Angstroms.

The anode and cathode of the organic EL device can each take any convenient conventional form. Where it is intended to transmit light from the organic EL device through the anode, this can be conveniently achieved by coating a thin conductive layer onto a light transmissive substrate—e.g., a transparent or substantially transparent glass plate or plastic film. In one form the organic EL devices of this invention can follow the historical practice of including a light transmissive anode formed of tin oxide or indium tin oxide coated on a glass plate, as disclosed by Gurnee et al U.S. Pat. No. 3,172,862, Gurnee U.S. Pat. No. 3,173,050, Dresner, "Double Injection Electroluminescence in Anthracene", *RCA Review*, Vol. 30, pp. 322–334, 1969; and Dresner U.S. Pat. No. 3,710,167, cited above. While any light transmissive polymeric film can be employed as a substrate, Gillson U.S. Pat. No. 2,733,367 and Swindells U.S. Pat. No. 2,941,104 disclose polymeric films specifically selected for this purpose.

As employed herein the term "light transmissive" means simply that the layer or element under discussion transmits greater than 50 percent of the light of at least one wavelength it receives and preferably over at least a 100 nm interval. Since both specular (unscattered) and diffused (scattered) emitted light are desirable device outputs, both translucent and transparent or substantially transparent materials are useful. In most instances the light transmissive layers or elements of the organic EL device are also colorless or of neutral optical density—that is, exhibiting no markedly higher absorption of light in one wavelength range as compared to another. However, it is, of course, recognized that the light transmissive electrode supports or separate superimposed films or elements can be tailored in their light absorption properties to act as emission trimming filters, if desired. Such an electrode construction is disclosed, for example, by Fleming U.S. Pat. No. 4,035,686. The light transmissive conductive layers of the electrodes, where fabricated of thicknesses approximating the wavelengths or multiples of the light wavelengths received can act as interference filters.

Contrary to historical practice, in one preferred form the organic EL devices of this invention emit light through the cathode rather than the anode. This relieves the anode of any requirement that it be light transmissive, and it is, in fact, preferably opaque to light in this form of the invention. Opaque anodes can be formed of any metal or combination of metals having a suitably high work function for anode construction. Preferred anode metals have a work function of greater than 4 electron volts (eV). Suitable anode metals can be chosen from among the high (>4 eV) work function metals listed below. An opaque anode can be formed of an opaque metal layer on a support or as a separate metal foil or sheet.

The organic EL devices of this invention can employ a cathode constructed of any metal, including any high or low work function metal, heretofore taught to be useful for this purpose. Unexpected fabrication, performance, and stability advantages have been realized by forming the cathode of a combination of a low work function metal and at least one other metal. A low work function metal is herein defined as a metal having a work function of less than 4 eV. Generally the lower the work function of the metal, the lower the voltage required for electron injection into the organic luminescent medium. However, alkali metals, the lowest work function metals, are too reactive to achieve stable EL device performance with simple device constructions and construction procedures and are excluded (apart from impurity concentrations) from the preferred cathodes of this invention.

Available low work function metal choices for the cathode (other alkali metals) are listed below by periods of The Periodic Table of Elements and categorized into 5 eV work function groups. All work functions provided are taken Sze, *Physics of Semiconductor Devices*, Wiley N.Y., 1969, p. 366.

| Period | Element | Work Function By eV Group |
| --- | --- | --- |
| 2 | Beryllium | 3.5–4.0 |
| 3 | Magnesium | 3.5–4.0 |
| 4 | Calcium | 2.5–3.0 |
|  | Scandium | 3.0–3.5 |
|  | Titanium | 3.5–4.0 |
|  | Manganese | 3.5–4.0 |
|  | Gallium | 3.5–4.0 |
| 5 | Strontium | 2.0–2.5 |
|  | Yttrium | 3.0–3.5 |
|  | Indium | 3.5–4.0 |
| 6 | Barium | ~2.5 |
|  | Lanthanum | 3.0–3.5 |
|  | Cerium | 2.5–3.0 |
|  | Praseodymium | 2.5–3.0 |
|  | Neodymium | 3.0–3.5 |
|  | Promethium | 3.0–3.5 |
|  | Samarium | 3.0–3.5 |
|  | Europium | 2.5–3.0 |
|  | Gadolinium | 3.0–3.5 |
|  | Terbium | 3.0–3.5 |
|  | Dysprosium | 3.0–3.5 |
|  | Holmium | 3.0–3.5 |
|  | Erbium | 3.0–3.5 |
|  | Thulium | 3.0–3.5 |
|  | Ytterbium | 2.5–3.0 |
|  | Lutetium | 3.0–3.5 |
|  | Hafnium | ~3.5 |
| 7 | Radium | 3.0–3.5 |
|  | Actinium | 2.5–3.0 |
|  | Thorium | 3.0–3.5 |
|  | Uranium | 3.0–3.5 |

From the foregoing listing it is apparent that the available low work function metals for the most part belong to the Group IIa or alkaline earth group of metals, the Group III group of metals (including the rare earth metals—i.e. yttrium and the lanthanides, but excluding boron and aluminum), and the actinide groups of metals. The alkaline earth metals, owing to their ready availability, low cost, ease of handling, and minimal adverse environmental impact potential, constitute a preferred class of low work function metals for use in the cathodes of EL devices of this invention. Magnesium and calcium are particularly preferred. Though significantly more expensive, the included Group III metals, particularly the rare earth metals, possess similar advantages and are specifically contemplated as preferred low work function metals. The low work function metals exhibiting work functions in the range of from 3.0 to 4.0 eV are generally more stable than metals exhibiting lower work functions and are therefore generally preferred.

A second metal included in the construction of the cathode has as one primary purpose to increase the stability (both storage and operational) of the cathode. It can be chosen from among any metal other than an alkali metal. The second metal can itself be a low work function metal and thus be chosen from the metals listed above having a work function of less than 4 eV, with the same preferences above discussed being fully applicable. To the extent that the second metal exhibits a low work function it can, of course, supplement the first metal in facilitating electron injection.

Alternatively, the second metal can be chosen from any of the various metals having a work function greater than 4 eV, which includes the elements more resistant to oxidation and therefore more commonly fabricated as metallic elements. To the extent the second metal remains invariant in the organic EL device as fabricated, it contributes to the stability of the device.

Available higher work function (4 eV or greater) metal choices for the cathode are listed below by periods of the Periodic Table of Elements and categorized into 0.5 eV work function groups.

| Period | Element | Work Function By eV Group |
|---|---|---|
| 2 | Boron | ~4.5 |
|   | Carbon | 4.5–5.0 |
| 3 | Aluminum | 4.0–4.5 |
| 4 | Vanadium | 4.0–4.5 |
|   | Chromium | 4.5–5.0 |
|   | Iron | 4.0–4.5 |
|   | Cobalt | 4.0–4.5 |
|   | Nickel | ~4.5 |
|   | Copper | 4.0–4.5 |
|   | Zinc | 4.0–4.5 |
|   | Germanium | 4.5–5.0 |
|   | Arsenic | 5.0–5.5 |
|   | Selenium | 4.5–5.0 |
| 5 | Molybdenum | 4.0–4.5 |
|   | Technetium | 4.0–4.5 |
|   | Ruthenium | 4.5–5.0 |
|   | Rhodium | 4.5–5.0 |
|   | Palladium | 4.5–5.0 |
|   | Silver | 4.0–4.5 |
|   | Cadmium | 4.0–4.5 |
|   | Tin | 4.0–4.5 |
|   | Antimony | 4.0–4.5 |
|   | Tellurium | 4.5–5.0 |
| 6 | Tantalum | 4.0–4.5 |
|   | Tungsten | ~4.5 |
|   | Rhenium | ~5.0 |
|   | Osmium | 4.5–5.0 |
|   | Iridium | 5.5–6.0 |
|   | Platinum | 5.5–6.0 |
|   | Gold | 4.5–5.0 |
|   | Mercury | ~4.5 |
|   | Lead | ~4.0 |
|   | Bismuth | 4.0–4.5 |
|   | Polonium | 4.5–5.0 |

From the foregoing listing of available metals having a work function of 4 eV or greater attractive higher work function metals for the most part are accounted for aluminum, the Group Ib metals (copper, silver and gold), the metals in Groups IV, V, and VI, and the Group VIII transition metals, particularly the noble metals from this group. Aluminum, copper, silver, gold, tin, lead, bismuth, tellurium, and antimony are particularly preferred higher work function second metals for incorporation in the cathode.

There are several reasons for not restricting the choice of the second metal based on either its work function or oxidative stability. The second metal is only a minor component of the cathode. One of its primary functions is to stabilize the first, low work function metal, and, surprisingly, it accomplishes this objective independent of its own work function and susceptibility to oxidation.

A second valuable function which the second metal performs is to reduce the sheet resistance of the cathode as a function of the thickness of the cathode. Since acceptably low sheet resistance levels (less than 100 ohms per square) can be realized at low cathode thicknesses (less than 250 Angstroms), cathodes can be formed which exhibit high levels of light transmission. This permits highly stable, thin, transparent cathodes of acceptably low resistance levels and high electron injection efficiencies to be achieved for the first time. This in turn permits (but does not require) the organic EL devices of this invention to be constructed with light transmissive cathodes and frees the organic EL devices of any necessity of having a light transmissive anode to achieve light emission through an electrode area.

A third valuable function which the second metal has been observed to perform is to facilitate vacuum vapor deposition of a first metal onto the organic luminescent medium of the EL device. In vapor deposition less metal is deposited on the walls of the vacuum chamber and more metal is deposited on the organic luminescent medium when a second metal is also deposited. The efficacy of the second metal in stabilizing organic EL device, reducing the sheet resistance of thin cathodes, and in improving acceptance of the first metal by the organic luminescence medium is demonstrated by the examples below.

Only a very small proportion of a second metal need be present to achieve these advantages. Only about 0.1 percent of the total metal atoms of the cathode need be accounted for by the second metal to achieve a substantial improvement. Where the second metal is itself a low work function metal, both the first and second metals are low work function metals, and it is immaterial which is regarded as the first metal and which is regarded as the second metal. For example, the cathode composition can range from about 0.1 percent of the metal atoms of the cathode being accounted for by one low work function metal to about 0.1 percent of the total metal atoms being accounted for by a second low work function metal. Preferably one of the two metals account for at least 1 percent and optimally at least 2 percent of the total metal present.

When the second metal is a relatively higher (at least 4.0 eV) work function metal, the low work function metal preferably accounts for greater than 50 percent of the total metals atoms of the cathode. This is to avoid reduction in electron injection efficiency by the cathode, but it is also predicated on the observation that the benefits of adding a second metal are essentially realized when the second metal accounts for less than 20 percent of the total metal atoms of the cathode.

Although the foregoing discussion has been in terms of a binary combination of metals forming the cathode, it is, of course, appreciated that combinations of three, four, or even higher numbers of metals are possible and can be employed, if desired. The proportions of the first metal noted above can be accounted for by any convenient combination of low work function metals and the proportions of the second metal can be accounted for any combination of high and/or low work function metals.

While the second metal or metals can be relied upon to enhance electrical conductivity, their minor proportion of the total cathode metal renders it unnecessary that these metals be present in an electrically conducting form. The second metal or metals can be present as compounds (e.g., lead, tin, or antimony telluride) or in an oxidized form, such as in the form of one or more metal oxides or salts. Since the first, low work function metal or metals account for the major proportion of the cathode metal content and are relied upon for electron conduction, they are preferably employed in their elemental form, although some oxidation may occur on aging.

Figure 4:
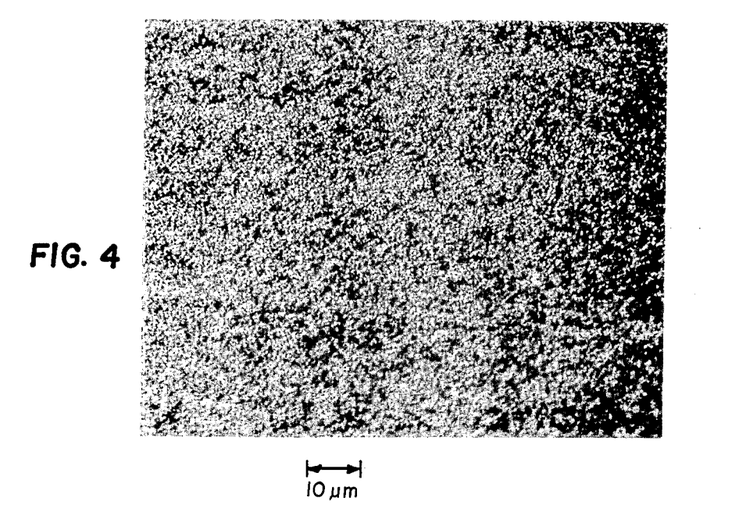
FIGS. 4 and 5 are micrographs of conventional and inventive cathodes, respectively.
Figure 5:
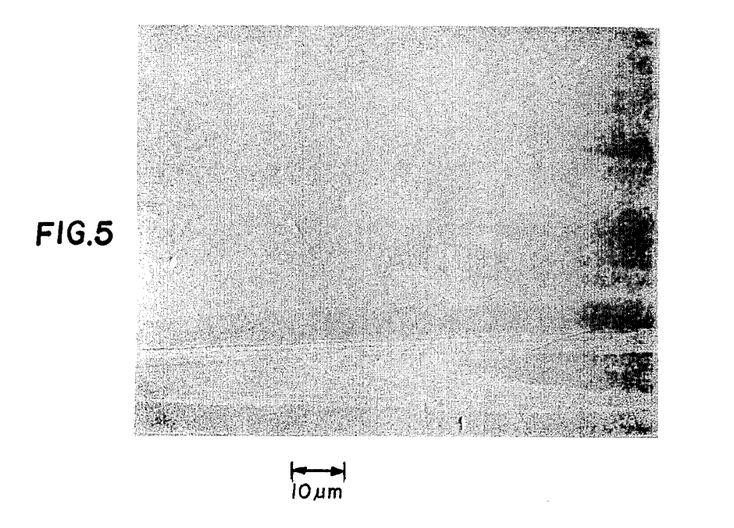

The manner in which the presence of a second metal physically intervenes to enhance cathode stability and light transmission enhancement while reducing sheet resistance can be appreciated by comparing FIGS. 4 and 5. FIG. 4 is a micrograph, enlarged to the scale indicated, of a vacuum vapor deposited conventional, prior art cathode consisting of magnesium. The thickness of the magnesium coating is 2000 Angstroms. The non-uniformity of the coating, detracting both from its electrical conductivity and its ability to transmit light, is readily apparent. Because of its non-uniformity the coating is also more readily penetrable and therefore more susceptible to oxidative degradation.

In direct contrast, the cathode of FIG. 5 illustrating the invention, also 2000 Angstroms in thickness, is smooth and featureless. This cathode is formed by the vacuum vapor deposition of magnesium and silver, with the magnesium and silver being present in an atomic ratio of 10:1. That is, the silver atoms are present in a concentration of 9 percent of total metal atoms present. The imperceptibly low granularity of the invention cathode is indicative of a higher and more uniform coverage of the deposition substrate. Identical glass substrates coated first with indium tin oxide and then oxine (CO-1) were employed in forming the FIGS. 4 and 5 coatings.

In depositing the first metal alone onto a substrate or onto the organic luminescent medium, whether from solution or, preferably, from the vapor phase, initial, spatially separated deposits of the first metal form nuclei for subsequent deposition. Subsequent deposition leads to the growth of these nuclei into microcrystals. The result is an uneven and random distribution of microcrystals, leading to a non-uniform cathode. By presenting a second metal during at least one of the nucleation and growth stages and, preferably, both, the high degree of symmetry which a single element affords is reduced. Since no two substances form crystal cells of exactly the same habit and size, any second metal reduces the degree of symmetry and at least to some extent acts to retard microcrystal growth. Where the first and second metals have distinctive crystal habits, spatial symmetry is further reduced and microcrystal growth is further retarded. retarding microcrystal growth favors the formation of additional nucleation sites. In this way the number of deposition sites is increased and a more uniform coating is achieved.

Depending upon the specific choice of metals, the second metal, where more compatible with the substrate, can produce a disproportionate number of the nucleation sites, with the first metal then depositing at these nucleation sites. Such a mechanism may, if fact, account for the observation that, with a second metal present, the efficiency with which the first metal is accepted by a substrate is significantly enhanced. It has been observed, for example, that less deposition of the first metal occurs on vacuum chamber walls when a second metal is being codeposited.

The first and second metals of the cathode are intimately intermingled, being codeposited. That is, the deposition of neither the first nor second metals is completed before at least a portion of the remaining metal is deposited. Simultaneous deposition of the first and second metals is generally preferred. Alternatively, successive incremental depositions of the first and second metals can be undertaken, which at their limit may approximate concurrent deposition.

While not required, the cathode, once formed can be given post treatments. For example, the cathode may be heated within the stability limits of the substrate in a reducing atmosphere. Other action on the cathode can be undertaken as a conventionally attendant feature of lead bonding or device encapsulation.

EXAMPLES

The invention and its advantages are further illustrated by the specific examples which follow. The term "atomic percent" indicates the percentage of a particular metal present, based on the total number of metal atoms present. In other words, it is analogous to mole percent, but is based on atoms rather than molecules. The term "cell" as employed in the examples denotes an organic EL device.

Example 1

Three Layer Organic Luminescence Medium

An EL device containing a three layer organic luminescent medium satisfying the requirements of the invention was constructed in the following manner:

(a) A transparent anode of indium tin oxide coated glass was polished with 0.05 $\mu$m alumina abrasive for a few minutes, followed by ultrasonic cleaning in a 1:1 (volume) mixture of isopropyl alcohol and distilled water. It was rinsed with isopropyl alcohol and then immersed in toluene vapor for about 5 minutes.

(b) A hole injecting PC-10 (350 Å) layer was deposited on the anode by vacuum deposition. PC-10 was evaporated from a quartz boat using a tungsten filament.

(c) A hole transporting ATA-1 (350 Å) layer was then deposited on top of the PC-10 layer. ATA-1 was also evaporated from a quartz boat using a tungsten filament.

(d) An electron injecting and transporting CO-1 (600 Å) layer was then deposited on top of the ATA-1 layer. CO-1 was also evaporated from a quartz boat using a tungsten filament.

(e) On top of the CO-1 layer was deposited a 2000 Å cathode formed of a 10:1 atomic ratio of Mg and Ag.

When a positive voltage was connected to the anode and the cathode was connected to ground, electroluminescence was visible through the transparent anode.

Operating the EL device for 500 hours at a constant current density of 5 mA/cm$^2$, only a modest voltage increase of from 6 to 7.2 volts was required to maintain the light output in the range of from 0.08 mW/cm$^2$, initial output, to 0.05 mW/cm$^2$, final output. This demonstrated a sustained high level of performance for the EL device.

Example 2

Two Layer Control

An EL device was constructed identically to that of Example 1, except for omitting the PC-10 layer.

While this EL device required a similar initial voltage as the EL device of Example 1 to achieve a current density of 5 mA/cm$^2$ and therefore a similar initial light output, an attempt to operate the EL device at a constant current density resulted in EL device failure after only 160 hours of operation. Whereas an initial applied potential of 6.5 volts produced an initial light output of 0.1 mW/cm$^2$, after 160 hours of operation, a potential of 20 volts was required to achieve a light output of 0.05 mW/cm$^2$.

Example 3

Metal Free Porphyrinic Compound

An El device was constructed identically to that of Example 1, except for substituting PC-7, metal free phthalocyanine, for PC-10, copper phthalocyanine. When tested under the same conditions as reported in Example 1, identical results were obtained. This demonstrated that a central metal atom is not required in a porphyrinic compound.

Examples 4-9

Other Porphyrinic Compounds

Five additional EL devices were constructed as described in Example 1, except that the porphyrinic compound and ATA-1 layers were 375 Angstroms in thickness and a different porphyrinic compound was incorporated in each device. Initial efficiencies and applied voltages when operated at a 0.05 mW/cm$^2$ light intensity are listed in Table I.

TABLE I

| Porphyrin | Efficiency (W/W) | Voltage |
|---|---|---|
| PC-11 | $2.2 \times 10^{-3}$ | 10.5 |
| PC-12 | $4.3 \times 10^{-3}$ | 6.2 |
| PC-13 | $4.8 \times 10^{-3}$ | 5.2 |
| PC-14 | $3.9 \times 10^{-3}$ | 5.8 |
| PC-15 | $2.4 \times 10^{-3}$ | 6.6 |
| PC-16 | $3.4 \times 10^{-3}$ | 7.4 |

The EL devices exhibited performance characteristics over extended periods of operation comparable to those of the EL device of Example 1.

Example 10

Higher Current Densities

Devices as described in Examples 1 and 2 were again tested, but with the maintained current density being increased to 20 mA/cm$^2$.

In testing the EL device of the invention, corresponding to that of Example 1, light intensity declined from an initial level of 0.45 mW/cm$^2$ to 0.06 mW/cm$^2$ at the end of 500 hours, with the initial and final applied potentials being 7 and 11 volts, respectively.

In testing the control EL, corresponding to that of Example 2, catastrophic cell failure occurred after only 17 hours of operation. Again, the superior stability of the EL device of the invention was clearly demonstrated.

Example 11-13

Varied Hole Transporting Layers

EL devices each containing a three layer organic luminescent medium satifying the requirements of the invention were constructed in the following manner:

(a) A transparent anode of indium tin oxide coated glass was polished with 0.05 μm alumina abrasive for a few minutes, followed by ultrasonic cleaning in a 1:1 (volume) mixture of isopropyl alcohol and distilled water. It was rinsed with isopropyl alcohol and blown dry with nitrogen.

(b) A hole injecting PC-10 (375 Å) layer was deposited on the anode by vacuum deposition. PC-10 was evaporated from a quartz boat using a tungsten filament.

(c) A hole transporting (375 Å) layer was then deposited on top of the PC-10 layer. The hole transporting material, an aromatic tertiary amine identified in Table II below, was also evaporated from a quartz boat using a tungsten filament.

(d) An electron injecting and transporting CO-1 (600 Å) layer was then deposited on top of the hole transporting layer. CO-1 was also evaporated from a quartz boat using a tungsten filament.

(e) On top of the CO-1 layer was deposited a 2000 Å cathode formed of a 10:1 atomic ratio of Mg and Ag.

TABLE II

| Cell | ATA | Light Output mW/cm$^2$ | | | | | |
|---|---|---|---|---|---|---|---|
| | | 0 | 50 | 100 | 500 | 1000 | 2000 (hrs.) |
| Ex. 11 | 1 | 1.15 | 0.25 | 0.1 | <0.1 | | |
| Ex. 12 | 7 | 0.8 | 0.6 | 0.5 | 0.3 | 0.2 | 0.12 |
| Ex. 13 | 8 | 0.5 | 0.35 | 0.3 | 0.22 | 0.17 | |

The EL devices of Examples 11 and 12 were driven at a current density of 40 mA/cm$^2$ while the EL device of Example 13 was driven at a current density of 20 mA/cm$^2$. These high current densities were chosen to accelerate testing. Light outputs at these elevated current density levels were well in excess of that required to produce light of adequate brightness for display applications. All of the devices demonstrated acceptable stability levels. The results further demonstrate the superiority of tetraaryldiamines of the type called for by formula (VI).

Examples 14 and 15

Multiple Hole Transporting Layers

An EL device representing Example 14 was prepared in the following manner:

(a) A transparent anode of indium tin oxide coated glass was polished with 0.05 μm alumina abrasive for a few minutes, followed by ultrasonic cleaning in a 1:1 (volume) mixture of isopropyl alcohol and distilled water. It was rinsed with isopropyl alcohol and blown dry with nitrogen.

(b) A hole injecting PC-10 (375 Å) layer was deposited on the anode by vacuum deposition. PC-10 was evaporated from a quartz boat using a tungsten filament.

(c) A triarylamine (ATA-1) first hole transporting (185 Å) layer was then deposited on top of the PC-10 layer. ATA-1 was also evaporated from a quartz boat using a tungsten filament.

(d) A tetraaryldiamine (ATA-7) second hole transporting (185 Å) layer was then deposited on top of the ATA-1 layer. ATA-7 was also evaporated from a quartz boat using a tungsten filament.

(e) An electron injecting and transporting CO-1 (600 Å) layer was then deposited on top of the hole transporting layer. CO-1 was also evaporated from a quartz boat using a tungsten filament.

(f) On top of the CO-1 layer was deposited a 2000 Å cathode formed of a 10:1 atomic ratio of Mg and Ag.

An EL device representing Example 15 was constructed identically to that of Example 14, except that the order of deposition of the hole transporting layers (c) and (d) was reversed.

In testing both EL devices were electrically biased to maintain a current density of 40 mA/cm². The results are summarized in Table III.

TABLE III

| Cell | ATA | Light Output mW/cm² | | | |
|------|-----|---|----|-----|------------|
|      |     | 0 | 50 | 100 | 500 (hrs.) |
| Ex. 14 | 1/7 | 0.8 | 0.5 | 0.5 | 0.45 |
| Ex. 15 | 7/1 | 1.15 | 0.25 | 0.1 | <0.1 |

Both EL devices exhibited satisfactory stability. The 40 mA/cm² current density level was much higher than required to obtain adequate brightness levels. High current density levels were chosen to exaggerate variances in light output levels and to predict light variances to be expected on operating the EL devices at lower current densities over much longer time periods.

By comparing the performance of the two EL devices, it is apparent that a substantial improvement in performance can be realized by locating the tetraarydiamine hole injecting layer in contact with the electron injecting layer. By comparing Examples 11 and 12 in Table II and with Example 14 in Table III it is apparent that when both a tetraaryldiamine and a triarylamine hole transporting layer are present in a single EL device with the tetraaryldiamine hole injecting layer in contact with the electron injecting layer performance is realized that is superior to that obtained when either of the two amine layers is omitted.

The invention has been described in detail with particular reference to preferred embodiments thereof, but it will be understood that variations and modifications can be effected within the spirit and scope of the invention.

What is claimed is:

1. An electroluminescent device comprising in sequence, an anode, an organic hole injecting and transporting zone, an organic electron injecting and transporting zone, and a cathode, characterized in that
said organic hole injecting and transporting zone is comprised of
a layer in contact with said anode containing a hole injecting porphyrinic compound and
a layer containing a hole transporting aromatic tertiary amine interposed between said hole injecting layer and said electron injecting and transporting zone.

2. An electroluminescent device according to claim 1 in which said cathode contains a metal having a work function of less than 4 eV other than an alkali metal and is light transmissive.

3. An electroluminescent device according to claim 1 in which said hole transporting layer is comprised of
a tetraphenyldiamine layer contacting said electron injecting and transporting zone and
a triarylamine layer contacting said hole injecting layer.

4. An electroluminescent device according to claim 1 in which said aromatic tertiary amine is a diphenylamine.

5. An electroluminescent device according to claim 4 in which said diphenylamine is a carbazole.

6. An electroluminescent device according to claim 1 in which said aromatic tertiary amine is a triphenylamine.

7. An electroluminescent device according to claim 6 in which said triphenylamine is N,N,N-triphenylamine.

8. An electroluminescent device according to claim 1 in which said aromatic tertiary amine satisfies the structural formula:

wherein
$Q^1$ and $Q^2$ are independently aromatic tertiary amine moieties and
G is a linking group chosen from the class consisting of phenylene, cycloalkylene having 5 to 7 ring carbon atoms, or alkylene having from 1 to 6 carbon atoms, or a carbon to carbon bond.

9. An electroluminescent device according to claim 8 in which said aromatic tertiary amine is a triphenylamine satisfying the structural formula:

where
$R^1$ and $R^2$ each independently represents a hydrogen atom, a phenyl group, or an alkyl group of from 1 to 6 carbon atoms or $R^1$ and $R^2$ together represent the atoms completing a cycloalkyl group containing from 5 to 7 ring carbon atoms and
$R^3$ and $R^4$ each independently represents a phenyl group which is in turn substituted with a diphenylamino group, as indicated by the structural formula:

wherein $R^5$ and $R^6$ are independently selected phenyl groups.

10. An electroluminescent device according to claim 1 in which said aromatic tertiary amine is a tetraphenyldiamine.

11. An electroluminescent device according to claim 10 in which said tetraphenyldiamine satisfies the formula:

(VI)

wherein
Are is a phenylene group,
n is an integer of from 1 to 4, and
Ar, $R^7$, $R^8$, and $R^9$ are independently selected phenyl groups.

12. An electroluminescent device according to claim 1 in which said porphorinic compound is a metal containing porphorinic compound which satisfies the structural formula:

wherein
Q is $-N=$ or $-C(R)=$;
M is a metal, metal oxide, or metal halide;
R is hydrogen, alkyl, phenalkyl, phenyl, or alkylphenyl, each alkyl moiety containing from 1 to 6 carbon atoms, and
$T^1$ and $T^2$ represent hydrogen or together complete a unsaturated 6 membered ring containing ring atoms chosen from the group consisting of carbon, nitrogen, and sulfur atoms.

13. An electroluminescent device according to claim 1 in which said porphorinic compound is a metal free porphorinic compound which satisfies the structural formula:

wherein
Q is $-N=$ or $-C(R)=$;

R is hydrogen, alkyl, phenalkyl, phenyl, or alkylphenyl, each alkyl moiety containing from 1 to 6 carbon atoms, and
$T^1$ and $T^2$ represent hydrogen or together complete a unsaturated 6 membered ring containing ring atoms chosen from the group consisting of carbon, nitrogen, and sulfur atoms.

14. An electroluminescent device according to claim 1 in which said electron injecting and transporting zone is comprised of a stilbene or chelated oxinoid compound.

15. An electroluminescent device according to claim 14 in which said chelated oxinoid compound is represented by the formula:

wherein
Me represents a metal;
n is an integer of from 1 to 3; and
Z independently in each occurrence represents the atoms completing a nucleus having at least two fused aromatic rings.

16. An electroluminescent device comprising in sequence
an anode,
a hole injecting layer comprised of a porphyrinic compound,
a hole transporting layer comprised of an aromatic tertiary amine,
an electron injecting and transporting layer comprised of a chelated oxinoid compound, and
a cathode comprised of a layer consisting essentially of a plurality of metals other than alkali metals, at least one of said metals having work function greater than 4 eV.

17. An electroluminescent device according to claim 16 in which said anode is opaque and said cathode is light transmissive.

18. An electroluminescent device according to claim 16 in which said metal having a work function of less than 4 eV includes at least one alkaline earth metal, rare earth metal, or Group III metal.

19. An electroluminescent device according to claim 16 in which said cathode includes at least one metal having a work function greater than 4 eV.

20. An electroluminescent device comprising in sequence
an opaque anode, a hole injecting layer comprised of a phthalocyanine, a first hole transporting layer comprised of a tetraphenyldiamine, a second hole transporting layer comprised of a triphenylamine, an electron injecting and transporting layer comprised of a chelated oxinoid compound, and a light transmissive cathode comprised of a layer consisting essentially of a plurality of metals other than alkali metals, at least one of said metals having work function greater than 4 eV and being chosen from the group consisting of magnesium, a rare earth metal, or indium, and at least one other of said metals being chosen from the group consisting of aluminum, copper, silver, gold, tin, lead, bismuth, tellurium, indium, and antimony.

* * * * *